United States Patent
Yoon et al.

(10) Patent No.: US 6,445,234 B1
(45) Date of Patent: Sep. 3, 2002

(54) APPARATUS AND METHOD FOR ACCELERATING INITIAL LOCK TIME OF DELAYED LOCKED LOOP

(75) Inventors: Min-Ho Yoon; Jong-Hee Han, both of Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/473,685

(22) Filed: Dec. 29, 1999

(30) Foreign Application Priority Data

Dec. 30, 1998 (KR) .............................. 98-61147

(51) Int. Cl.[7] .............................................. H03L 7/00
(52) U.S. Cl. ...................................... 327/161; 327/163
(58) Field of Search ................................ 327/147, 149, 327/153, 156, 158, 161, 162, 163, 159; 375/371, 373, 376; 365/233

(56) References Cited

U.S. PATENT DOCUMENTS

| | | | |
|---|---|---|---|
| 5,355,037 A | * 10/1994 | Andressen et al. | ......... 327/159 |
| 5,771,264 A | * 6/1998 | Lane | ........................ 375/376 |
| 6,067,272 A | * 5/2000 | Foss et al. | ................... 365/233 |
| 6,125,157 A | * 9/2000 | Donnelly et al. | ........... 375/371 |

* cited by examiner

Primary Examiner—Timothy P. Callahan
Assistant Examiner—Linh Nguyen
(74) Attorney, Agent, or Firm—Jacobson Holman, PLLC

(57) ABSTRACT

An apparatus and method for accelerating an initial lock time of the DLL in a high rate double data rate (DDR) synchronous random access memory (SDRAM) is disclosed. The apparatus for accelerating an initial lock time of the DLL comprises a first clock generator for generating a reference clock signal based on the external synchronization clock signal; a phase comparator for applying a unit delay time and a multiple unit delay time to the internal clock signal and for comparing phases of the internal clock signal, a unit delayed internal clock signal and a multiple unit delayed internal clock signal with a phase of the reference clock signal; a shift controller for selecting an amount of delay time based on a comparison result; a delay unit for delaying the internal clock signal by the amount of delay time based on a selected amount of delay time; and a delay clock modeling unit for generating a modeled delay clock signal corresponding to a delayed internal clock signal and for providing the modeled delay clock signal with the phase comparator for applying a unit delay and a multiple unit delay time.

11 Claims, 5 Drawing Sheets

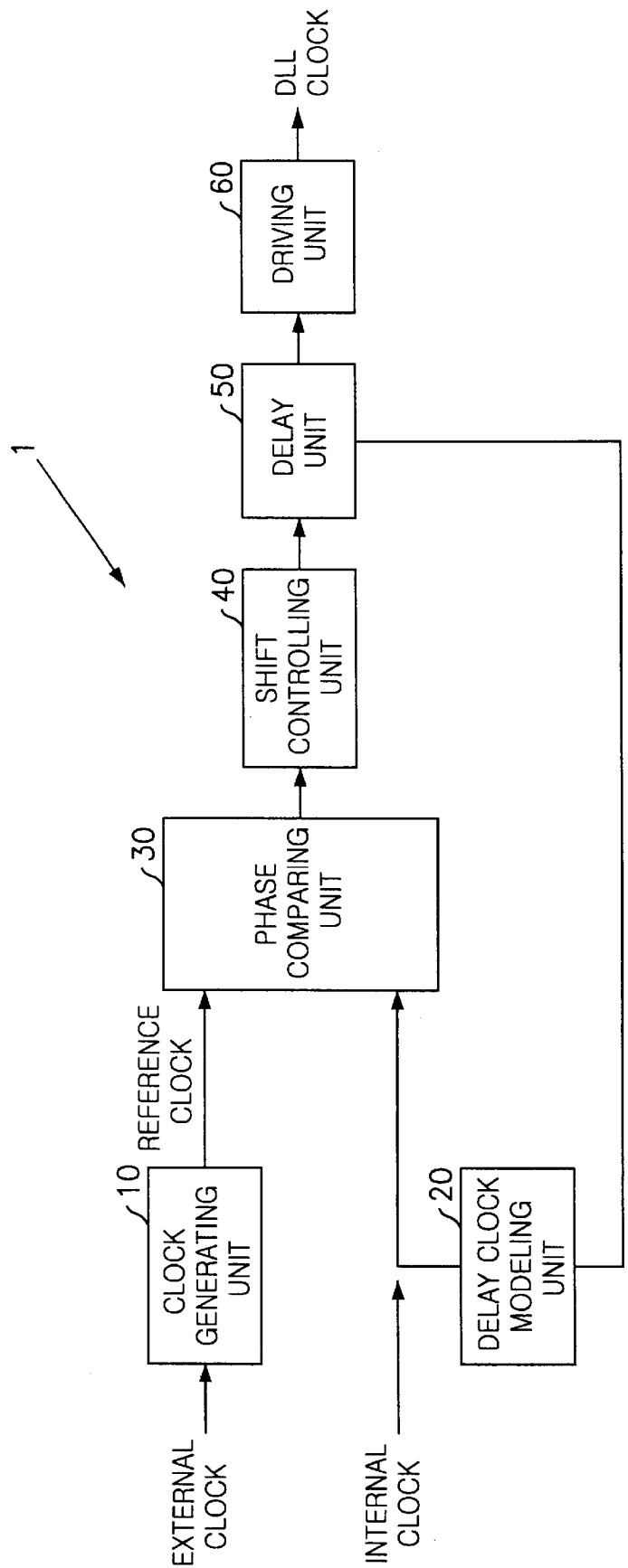

APPARATUS AND METHOD FOR ACCELERATING INITIAL LOCK TIME OF DELAYED LOCKED LOOP

BACKGROUND OF THE INVENTION

1. Field of the Invention

The present invention relates to a delay locked loop (DLL); and more particularly, to an apparatus and method for accelerating an initial lock time of the DLL in a high rate double data rate (DDR) synchronous random access memory (SDRAM).

2. Prior Art of the Invention

In general, a DLL corrects skew between an external synchronization clock signal and an internal clock signal, which is necessarily needed for the high rate memory device, e.g., a DDR SDRAM.

In conventional DLLS, a skewed internal clock signal is repeatedly compared with a reference external clock signal and applied by a unit delay time. The comparison is repeated until skew between the reference external clock signal and the skewed internal clock signal is smaller than the unit delay time, that is, an initial operation of the DLL is completed.

However, in the conventional DLL, the internal clock signal is repeatedly delayed by the unit delay time, and correction result, that is, a delayed internal clock signal, is compared with the reference external clock signal at every delay. Accordingly, the number of comparison is large and the large number of comparison makes an initial lock time of the DLL too long. For example, assume that 0.2 nsec unit delay time is used, in order to perform 8 nsec delay operation by using the conventional method which compares the phase of the DLL clock signal with the reference clock signal at every eight clocks, the correction is completed after at least 40 comparisons, that is, 320 clocks. This problem is critical to the high rate device.

SUMMARY OF THE INVENTION

Therefore, an object of the invention is to provide an apparatus and method for accelerating an initial lock time of the DLL which repeatedly applies multiple unit delay time along with unit delay time to a reference clock signal or an internal clock signal.

In accordance with one embodiment of the present invention, there is provided an apparatus for accelerating an initial lock time of DLL (Delayed Locked Loop) which removes skew between an external synchronization clock signal and an internal clock signal, comprising: means for generating a reference clock signal based on the external synchronization clock signal; means for applying a unit delay time and a multiple unit delay time to the internal clock signal and for comparing phases of the internal clock signal, a unit delayed internal clock signal and a multiple unit delayed internal clock signal with a phase of the reference clock signal; means for selecting an amount of delay time based on a comparison result; means for delaying the internal clock signal by the amount of delay time based on a selected amount of delay time; and means for generating a modeled delay clock signal corresponding to a delayed internal clock signal and for providing the modeled delay clock signal with said means for applying a unit delay and a multiple unit delay time.

In accordance with one embodiment of the present invention, there is provided an apparatus for accelerating an initial lock time of DLL (Delayed Locked Loop) which removes skew between an external synchronization clock signal and an internal clock signal, comprising: means for generating a reference clock signal based on the external synchronization clock signal; means for applying a unit delay time and a multiple unit delay time to the reference clock signal and for comparing phases of the reference clock signal, a unit delayed reference clock signal and a multiple unit delayed reference clock signal with a phase of the internal clock signal; means for selecting an amount of delay time based on a comparison result; means for delaying the reference clock signal by the amount of delay time based on a selected amount of delay time; and means for generating a modeled delay clock signal corresponding to a delayed reference clock signal and for providing the modeled delay clock signal with said means for applying a unit delay and a multiple unit delay time.

In accordance with one embodiment of the present invention, there is provided a method for accelerating an initial lock time of DLL (Delayed Locked Loop) which removes skew between an external synchronization clock signal and an internal clock signal, comprising the steps of: a) receiving a reference clock signal an internal clock signal; b) comparing the reference clock signal with the internal clock signal and determining an amount of delay time between the two clock signals; c) reducing the amount of delay time by one unit delay if the amount of the delay time is larger than a predetermined value; d) increasing the amount of delay time by one unit delay or a number of unit delay time if the amount of the delay time is smaller than the predetermined value; and e) repeating said steps a) to d) until a phase difference between the reference clock signal and the internal clock signal is smaller than the unit delay.

BRIEF DESCRIPTION OF THE DRAWINGS

Other object and aspects of the invention will become more apparent from the following description of the embodiments with reference to the accompanying drawings in which:

FIG. 1 is a block diagram of DLL initial lock time accelerator in accordance with the present invention;

DETAILED DESCRIPTION OF THE INVENTION

Figure 2A:
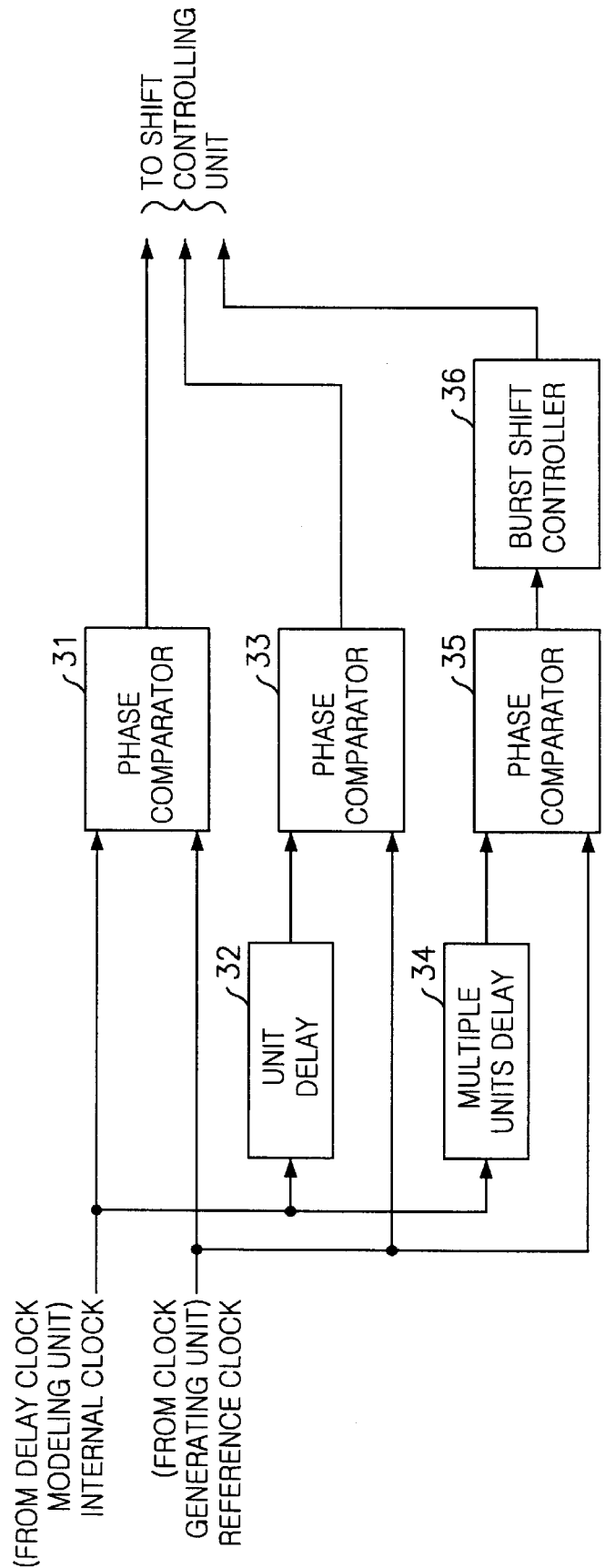
FIGS. 2A and 2B are detailed block diagrams of a phase comparing unit of FIG. 1.

Hereinafter, embodiments of the present invention will be described in detail with reference to accompanying drawings.

Referring to FIG. 1, a DLL initial lock time accelerator 1 in accordance with the present invention comprises a clock generating unit 10, a delay clock modeling unit 20, a phase comparing unit 30, a shift controlling unit 40, a delay unit 50 and a driving unit 60.

The clock generating unit 10 generates a reference clock signal based on an external synchronization clock signal. The phase comparing unit 30 compares the reference clock signal from the clock generating unit 10 with an internal clock signal and applies both of the unit delay time and the multiple unit delay time to the internal clock signal. Then the phase comparing unit 30 compares the reference clock signal with the delayed internal clock signal again. The phase comparing unit 30 repeats comparing and delaying until the initial operation of the DLL. The shift controlling unit 40 determines an amount of delay based on the comparing result from the phase comparing unit 30. The delay unit 50 includes delay chains having NAND gates and inverters, and delays the clock signals by an amount of delay selected in the shift controlling unit 40. The delay clock modeling unit 20 provides the phase comparing unit 30 with a delay clock model corresponding to the current clock signal delayed by the delay unit 50. The driving unit 60 outputs the DLL clock signals applied from the delay unit 50.

Figure 2B:
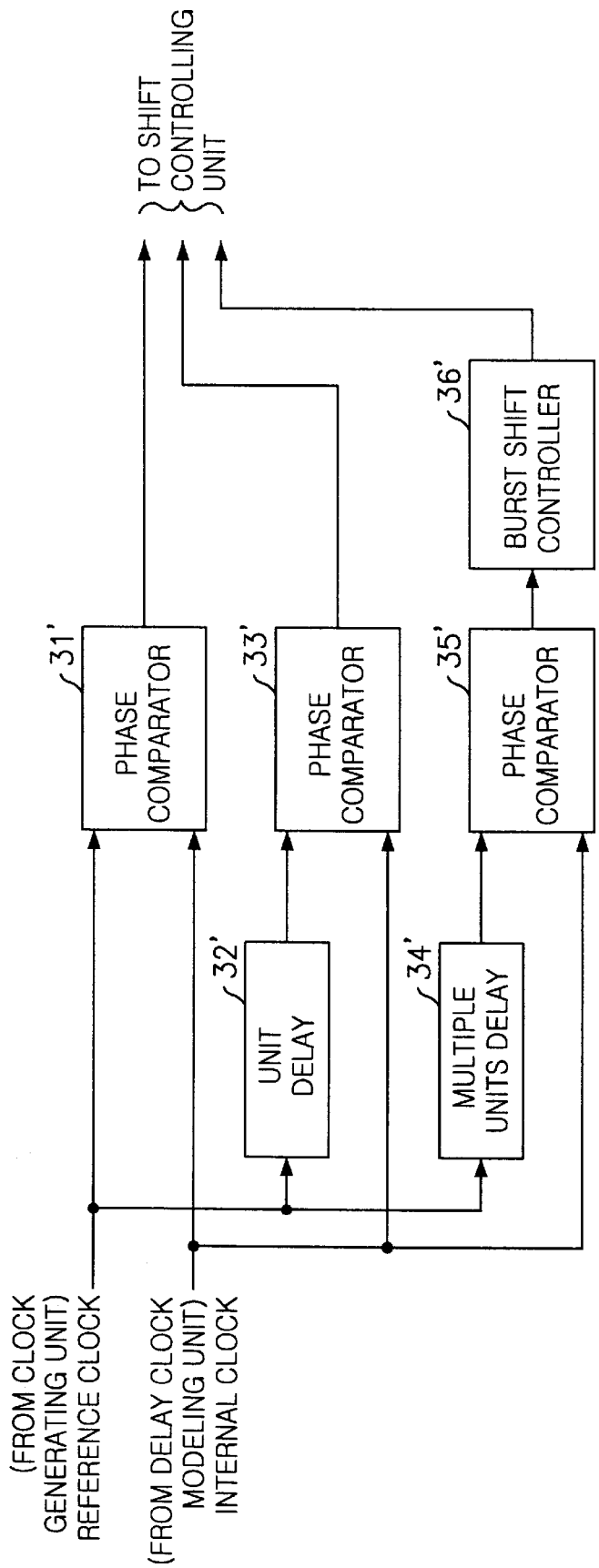

FIGS. 2A and 2B show detailed block diagrams of a phase comparing unit of FIG. 1. FIG. 2B is another embodiment of the phase comparing unit of FIG. 1.

FIG. 2A shows that the phase comparing unit 30 includes phase comparators 31, 33 and 35, a unit delay 32, a multiple unit delay 34 and a burst shift controller 36. FIG. 2B shows that the phase comparing unit 30 includes phase comparators 31', 33' and 35', a unit delay 32', a multiple unit delay 34' and a burst shift controller 36'.

Figure 3:
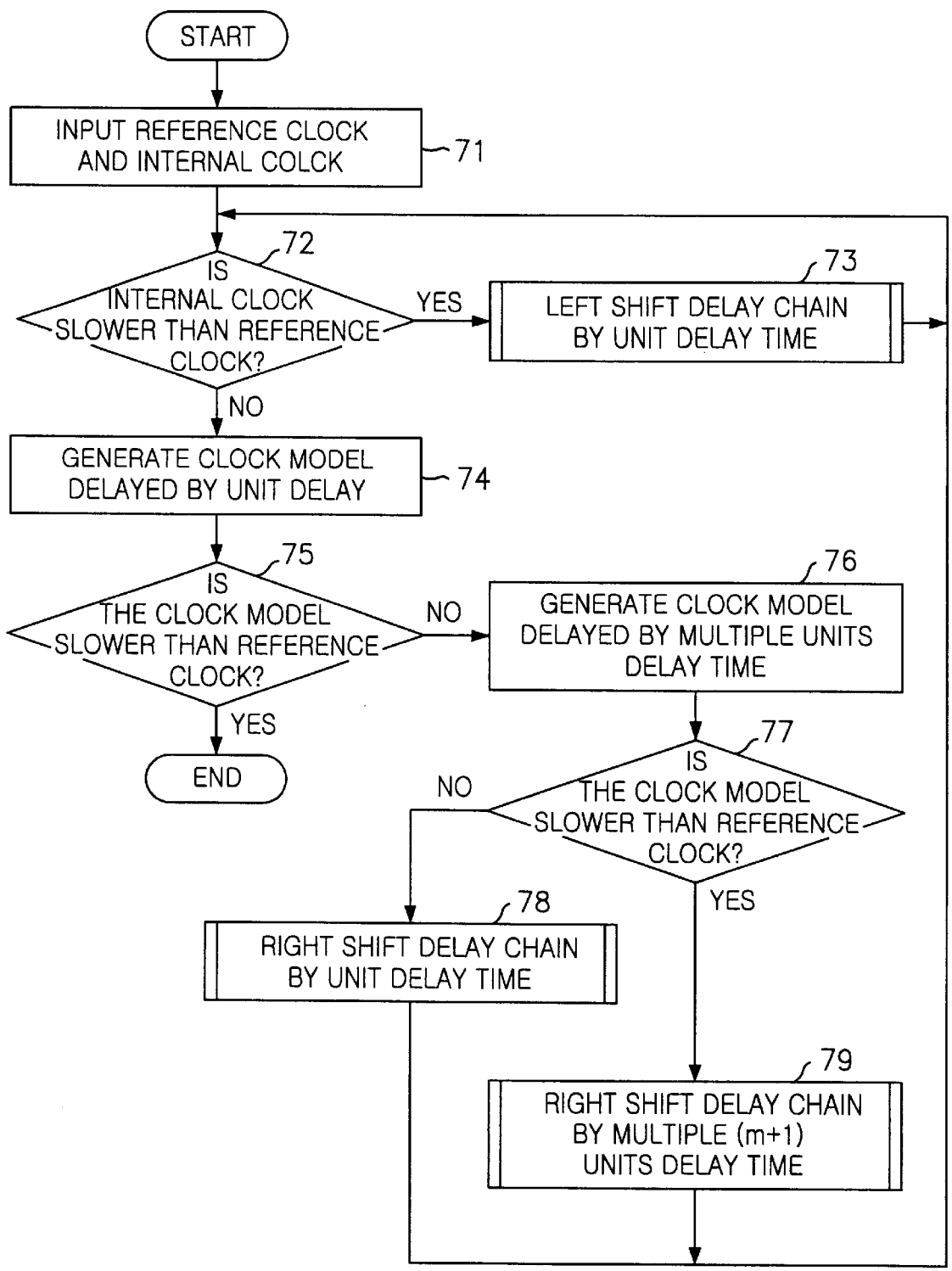
FIG. 3 is a flow chart illustrating a method for accelerating a DLL initial lock time in accordance with the present invention.

Referring to FIGS. 2A and 3, the phase comparator 31 compares the reference clock signal with the internal clock signal. The unit delay 32 unit-delays the internal clock signal. The phase comparator 33 compares the reference clock signal with the unit-delayed internal clock signal. The multiple unit delay 34 delays the internal clock signal by multiple unit delay time. The comparator 35 compares the reference clock signal with the multiple-delayed internal clock signal. The burst shift controller 36 generates a control signal based on the comparing result of the phase comparator 35 in order to shift the delay chain by multiple unit delay time in the delay unit 50.

Similarly, referring to FIG. 2B, which is another variation of the embodiment depicted in FIG. 2A, the phase comparator 31' compares the reference clock signal with the internal clock signal. The unit delay 32' unit-delays the reference clock signal. The phase comparator 33' compares the internal clock signal with the unit-delayed reference clock signal. The multiple unit delay 34' delays the reference clock signal by multiple unit delay time. The comparator 35' compares the internal clock signal with the multiple-delayed reference clock signal. The burst shift controller 36' generates a control signal based on the comparing result of the phase comparator 35' in order to shift the delay chain by multiple unit delay time in the delay unit 50.

Figure 4A:
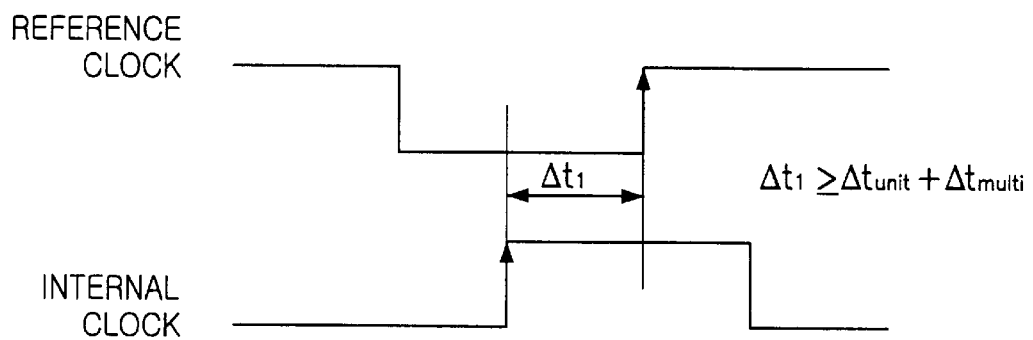
FIGS. 4A, 4B and 4C are timing diagrams illustrating operations of the DLL initial lock time accelerator.
Figure 4B:
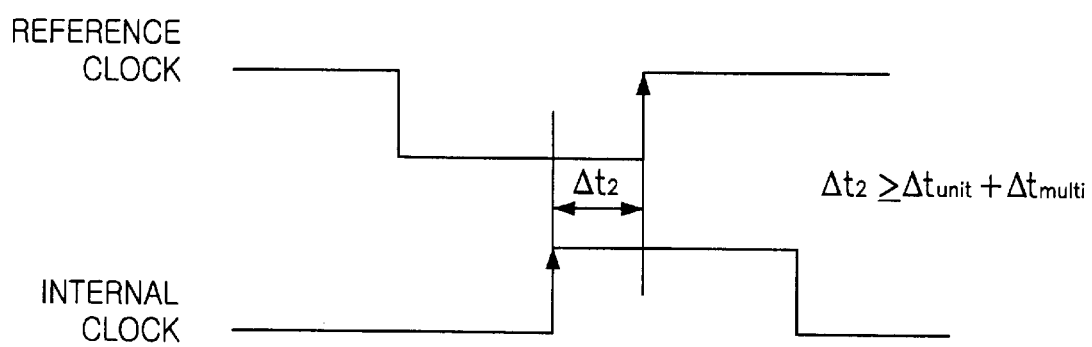
Figure 4C:
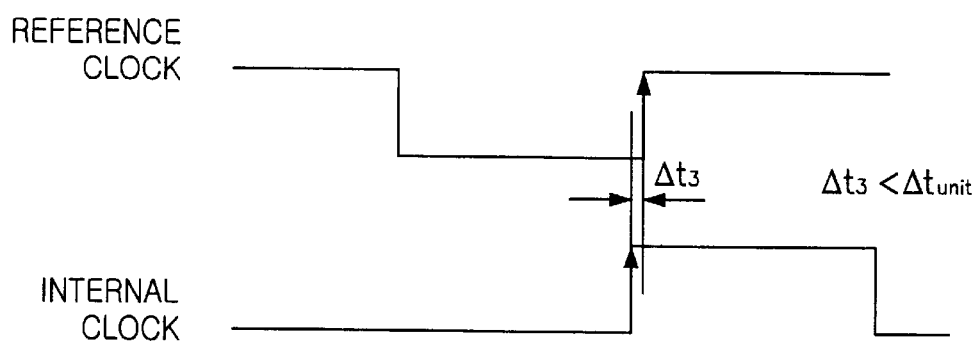

The initial lock time accelerator 1 compares an edge of the reference clock signal with an edge of the internal clock signal and removes the skew t1 between the two clock signals (see FIG. 4A).

The initial lock time accelerator 1 provides the reference clock signal or the internal clock signal with both the unit delay time and the multiple unit delay time, and determines whether a difference t2 between the reference clock signal and the internal clock signal previously delayed is larger than a delay sum $t_{sum}$ ($t_{sum}=t_{unit}+t_{multi}$) of the two kinds of delay, the unit delay time and the multiple unit delay time. If the time difference t2 is larger than the delay sum $t_{sum}$, the internal clock signal is delayed again by the delay sum $t_{sum}$. If the time difference t2 is smaller than the delay sum $t_{sum}$, the internal clock signal is delayed by the unit delay $t_{unit}$.

The operations as mentioned above are repeated until time difference t3 between the reference clock signal and internal clock signal previously delayed, to thereby the initial DLL operation is completed within a shorter time.

For example, assume that the delay sum is the same as the four unit delay time (0.2 nsec·4=0.8 nsec), in order to perform 8 nsec delay by operating the phase comparing unit at every eight clocks, ten times repetitive operations are needed. That is, only 80 clocks which is one fourth in comparison with the conventional DLL initial lock time are needed.

Hereinafter, a method for accelerating the DLL initial lock time will be described with reference to FIG. 3.

First, if the reference clock signal and the internal clock signal are respectively inputted to the phase comparing unit 30 at step 71, the phase comparing unit 30 determines whether the internal clock signal is slower than the reference clock signal at step 72.

If the internal clock signal is later than the reference clock signal, in other words, delay is too large, the two clock signals are compared again after the delay chain in the delay unit 50 is left shifted by one unit delay time, that is, the amount of the delay is reduced by unit delay time at step 73. If not, a first clock model delayed by one unit delay time is generated at step 74.

Then, the process continues with step 75 to determine whether the first clock model is slower than the reference clock signal. If the first clock model is not slower than the reference clock signal, a second clock model delayed by a selected number (m) of unit delay time is generated at step 76. Then the second clock model is determined to be slower than the reference clock signal at step 77.

If the second clock model is slower than the reference clock signal, in other words, the delay is too small, the two clock signals are compared again at step 72 after the delay chain in the delay unit 50 is right shifted by one more than the selected number (m+1) of unit delay time at step 79.

If the second clock model is faster than the reference clock signal, in other words, if the unit delay time is too small and the selected number of unit delay time is too large, the two clock signals are compared again at step 72 after the delay chain in the delay unit 50 is right shifted by the unit delay time in comparison with the previous clock signal at step 78.

Then, if the internal clock signal is faster than the reference clock signal, in other words, the amount of the delay is too little at step 72, the clock model delayed by one unit delay time in comparison with the current clock signal is generated at step 74, and the first clock model is compared with the reference clock signal. At this time, if the clock model is slower than the reference clock signal, that is, if the amount of the delay is too much at step 75, DLL initial operation is completed.

In the embodiment mentioned above, the reference clock signal is locked, the internal clock signal is delayed and compared. However, one skilled in the art can easily appreciate that the internal clock signal is locked and the reference clock signal is delayed, thereby removing the skew between two clock signals. Also, the amount of multiple unit delay time can be variously changed in accordance with a designer s intention or circuit environment.

The DLL initial lock time accelerator in accordance with the present invention reduces time for correcting the skew between the reference clock signal and the internal clock signal, thereby DLL initial operation can be completed within a shorter time. Accordingly, in the present invention, the initial time margin enough to correct skew can be obtained, and DLL operation can be stably and rapidly performed even though the DLL correction range is large. Therefore, devices utilizing the DLL initial lock time accelerator in accordance with the present invention are improved in high speed operation.

Although the preferred embodiments of the invention have been disclosed for illustrative purpose, those skilled in the art will appreciate that various modifications, additions and substitutions are possible, without departing from the scope and spirit of the invention as disclosed in accompanying claims.

What is claimed is:

1. An apparatus for accelerating an initial lock time of DLL (Delayed Locked Loop) which removes skew between an external synchronization clock signal and an internal clock signal, comprising:

means for generating a reference clock signal based on the external synchronization clock signal;

means for applying a unit delay time and a multiple unit delay time to the internal clock signal and for comparing phases of the internal clock signal, a unit delayed internal clock signal and a multiple unit delayed internal clock signal with a phase of the reference clock signal;

means for selecting an amount of delay time based on a comparison result;

means for delaying the internal clock signal by the amount of delay time based on a selected amount of delay time; and means for generating a modeled delay clock signal corresponding to a delayed internal clock signal and for providing the modeled delay clock signal with said means for applying a unit delay and a multiple unit delay time.

2. The apparatus as claimed in claim 1, wherein said means for applying a unit delay and a multiple unit delay time includes:

a first comparing means for comparing the internal clock signal with the reference clock signal;

a means for delaying the internal clock signal by one unit delay time;

a second comparing means for comparing the unit delayed internal clock signal with the reference clock signal;

a means for delaying the internal clock signal by multiple unit delay time;

a third comparing means for comparing the multiple delayed internal clock signal with the reference clock signal; and means for generating a control signal so as to shift the internal clock signal by the multiple unit delay time, based on the third comparing means.

3. The apparatus as claimed in claim 2, further comprising a means for outputting the delayed clock signal.

4. An apparatus for accelerating an initial lock time of DLL (Delayed Locked Loop) which removes skew between an external synchronization clock signal and an internal clock signal, comprising:

means for generating a reference clock signal based on the external synchronization clock signal;

means for applying a unit delay time and a multiple unit delay time to the reference clock signal and for comparing phases of the reference clock signal, a unit delayed reference clock signal and a multiple unit delayed reference clock signal with a phase of the internal clock signal;

means for selecting an amount of delay time based on a comparison result;

means for delaying the reference clock signal by the amount of delay time based on a selected amount of delay time; and means for generating a modeled delay clock signal corresponding to a delayed reference clock signal and for providing the modeled delay clock signal with said means for applying a unit delay and a multiple unit delay time.

5. The apparatus as claimed in claim 1, wherein said means for applying a unit delay and a multiple unit delay time includes:

a first comparing means for comparing the reference clock signal with the internal clock signal;

a means for delaying the reference clock signal by one unit delay time;

a second comparing means for comparing the unit delayed reference clock signal with the internal clock signal;

a means for delaying the reference clock signal by multiple unit delay time;

a third comparing means for comparing the multiple delayed reference clock signal with the internal clock signal; and means for generating a control signal so as to shift the reference clock signal by the multiple unit delay time, based on the third comparing means.

6. The apparatus as claimed in claim 4, further comprising a means for outputting the delayed clock signal.

7. A method for accelerating an initial lock time of DLL (Delayed Locked Loop) which removes skew between an external synchronization clock signal and an internal clock signal, comprising the steps of:

a) receiving a reference clock signal and an internal clock signal;

b) comparing the reference clock signal with the internal clock signal and determining an amount of delay time between the two clock signals;

c) reducing the amount of delay time by one unit delay if the amount of the delay time is larger than a predetermined value;

d) increasing the amount of delay time by one unit delay or a number of unit delay time if the amount of the delay time is smaller than the predetermined value, wherein the step d) includes:

d1) generating a first clock model which is delayed by the unit delay time in comparison with the internal clock signal;

d2) determining whether the first clock model is faster than the reference clock signal;

d3) generating a second clock model which is delayed by a predetermined number of unit delay time in comparison with the first clock model if the first clock model is faster than the reference clock signal;

d4) shifting a delay chain to a direction in order to increase the amount of delay time by the unit delay time of the internal clock signal if the first clock model is faster than the reference clock signal; and d5) shifting a delay chain to a direction in order to increase the amount of delay time by one more unit delay time than the predetermined number of unit delay time of the internal clock signal if the first clock model is slower than the reference clock signal; and e) repeating said steps a) to d) until a phase difference between the reference clock signal and the internal clock signal is smaller than the unit delay.

8. The method as claimed in claim 7, wherein said step c) includes the steps of:

f) determining whether the internal clock signal is slower than the reference clock signal; and g) shifting a delay chain to a direction in order to reduce the unit delay time of the internal clock signal.

9. An apparatus for accelerating an initial lock time of DLL (Delayed Locked Loop) which removes skew between an external synchronization clock signal and an internal clock signal, comprising:

means for generating a reference clock signal based on the external synchronization clock signal;

means for applying a unit delay time and a multiple unit delay time to the reference clock signal and for comparing phases of the reference clock signal, a unit delayed reference clock signal and a multiple unit delayed reference clock signal with a phase of the internal clock signal;

means for selecting an amount of delay time based on a comparison result;

means for delaying the reference clock signal by the amount of delay time based on a selected amount of delay time; and means for generating a modeled delay clock signal corresponding to a delayed reference clock signal and for providing the modeled delay clock signal with said means for applying a unit delay and a multiple unit delay time.

10. The apparatus as claimed in claim 9, wherein said means for applying a unit delay and a multiple unit delay time includes:

a first comparing means for comparing the reference clock signal with the internal clock signal;

a means for delaying the reference clock signal by one unit delay time;

a second comparing means for comparing the unit delayed reference clock signal with the internal clock signal;

a means for delaying the reference clock signal by multiple unit delay time;

a third comparing means for comparing the multiple delayed reference clock signal with the internal clock signal; and means for generating a control signal so as to shift the reference clock signal by the multiple unit delay time, based on the third comparing means.

11. The apparatus as claimed in claim 10, further comprising a means for outputting the delayed clock signal.

* * * * *